United States Patent
Shin (10) Patent No.: US 7,683,451 B2
(45) Date of Patent: Mar. 23, 2010

(54) CMOS IMAGE SENSORS WITH LIGHT SHIELDING PATTERNS

(75) Inventor: Jong-Cheol Shin, Gyeonggi-do (KR)

(73) Assignee: Samung Electronics Co., Ltd. (KR)

( * ) Notice: Subject to any disclaimer, the term of this patent is extended or adjusted under 35 U.S.C. 154(b) by 13 days.

(21) Appl. No.: 11/974,981

(22) Filed: Oct. 17, 2007

(65) Prior Publication Data

US 2008/0142919 A1 Jun. 19, 2008

(30) Foreign Application Priority Data

Dec. 19, 2006 (KR) .................. 10-2006-0130190

(51) Int. Cl.
H01L 21/0232 (2006.01)
(52) U.S. Cl. .................. 257/435; 257/431; 257/443
(58) Field of Classification Search .............. 257/431, 257/435, 443
See application file for complete search history.

(56) References Cited

U.S. PATENT DOCUMENTS

| 7,205,623 B2 * | 4/2007 | Hong et al. .................. 257/435 |
| 2008/0017945 A1 * | 1/2008 | Wu et al. .................. 257/440 |
| 2008/0036023 A1 * | 2/2008 | Park .................. 257/432 |

FOREIGN PATENT DOCUMENTS

| JP | 2002329854 | 11/2002 |
| JP | 2005340338 | 12/2005 |
| KR | 1020000015467 | 3/2000 |
| KR | 1020010015089 A | 2/2001 |
| KR | 1020010082731 | 8/2001 |
| WO | 98/11608 | 3/1998 |

* cited by examiner

Primary Examiner—Phuc T Dang
(74) Attorney, Agent, or Firm—Myers Bigel Sibley & Sajovec

(57) ABSTRACT

An image sensor includes a semiconductor substrate including an active pixel region and an optical black region, a wiring pattern on the active pixel region and on the optical black region, and a light shielding pattern on the wiring pattern in the optical black region, the light shielding pattern including an opening therein. A dummy pattern is in the optical black region and is spaced apart from the light shielding pattern. The dummy pattern blocks light incident through the openings of the light shielding patter. An inter-metal dielectric layer fills spaces between the patterns, and a passivation layer is on the inter-metal dielectric layer. The dummy pattern includes an opening therein, and a hydrogen diffusion path is provided from the passivation layer, through the opening in the light shielding pattern and the opening in the dummy pattern, to the semiconductor substrate. The dummy pattern may be on the same level as the wiring pattern.

19 Claims, 11 Drawing Sheets

CMOS IMAGE SENSORS WITH LIGHT SHIELDING PATTERNS

CROSS-REFERENCE TO RELATED APPLICATION AND CLAIM OF PRIORITY

This application claims priority from Korean Patent Application No. 10-2006-0130190 filed on Dec. 19, 2006 in the Korean Intellectual Property Office, the disclosure of which is incorporated herein by reference in its entirety.

BACKGROUND

The present invention relates to complementary metal oxide semiconductor (CMOS) image sensors and methods of forming the same, and more particularly, to CMOS image sensors including active pixel regions and optical black regions, and methods of forming the same.

A complementary metal oxide semiconductor (CMOS) image sensor is an element that converts optical images to electrical signals. CMOS image sensors with improved performance are increasingly desired for various applications, such as digital cameras, camcorders, personal communication systems (PCS), game consoles, security cameras, medical micro cameras, robots, and the like.

A unit pixel in a CMOS image sensor includes a photoelectric converter and a charge transfer unit. The charge transfer unit transfers, to a charge detector, electric charges that the photoelectric converter generates by photoelectrically converting incident light.

In the course of fabricating a CMOS image sensor, etching and ion implantation operations are repeatedly performed on a semiconductor substrate. These repeated operations may cause damage to silicon-oxygen bonds on the surface of the semiconductor substrate, thereby generating dangling bonds of —Si—O— or —Si—. The dangling bonds may reduce dark current, which flows from a photoelectric converter to a charge transfer unit, which may cause the reliability of a CMOS image sensor to deteriorate. To remove the dangling bonds, hydrogen may be diffused into the semiconductor substrate. To diffuse hydrogen, a passivation layer may be formed on the substrate and an annealing operation may be carried out.

A CMOS image sensor includes an active pixel region and an optical black region. The active pixel region receives incident light and converts the light into an electrical signal, and the optical black region blocks incident light to provide a standard for a black (i.e. no light) signal on the active pixel region. In the optical black region, the light shield layer that is formed to intercept incident light may also limit or prevent hydrogen diffusion into the semiconductor substrate during the hydrogen annealing operation. Due to the presence of the light shield layer, dangling bonds can be removed from the active pixel region, but may not be removed from the optical black region. Thus, signals output from the active pixel region and the optical black region may be different from each other, which may decrease the reliability of the CMOS image sensor.

SUMMARY

An image sensor according to some embodiments of the invention includes a semiconductor substrate including an active pixel region and an optical black region, a wiring pattern on the active pixel region and on the optical black region, and a light shielding pattern on the wiring pattern in the optical black region, the light shielding pattern including an opening therein. A dummy pattern may be in the optical black region and may be spaced apart from the light shielding pattern. The dummy pattern may be configured to block light incident through the openings of the light shielding pattern. An inter-metal dielectric layer fills spaces between the wiring pattern, the light shielding pattern, and the dummy pattern, and a passivation layer may be on the inter-metal dielectric layer.

The dummy pattern may include an opening therein, and a hydrogen diffusion path may be provided from the passivation layer, through the opening in the light shielding pattern and the opening in the dummy pattern, to the semiconductor substrate. The dummy pattern may be on the same level as the wiring pattern.

The light shielding pattern may be on the active pixel region as well, and the light shielding pattern on the active pixel region may be aligned with the wiring pattern.

A light receiving region and a peripheral circuit region may be defined on each of the active pixel region and the optical black region, a photoelectric converter may be in the light receiving region, and the wiring pattern may be on the peripheral circuit region.

The openings of the light shielding pattern may be on the light receiving region. Furthermore, the dummy pattern may be on the light receiving region.

The wiring pattern may include a first wiring pattern and a second wiring pattern, and the second wiring pattern may be aligned on the first wiring pattern. The dummy pattern may include a first dummy pattern and a second dummy pattern. The first dummy pattern may be on the same level as the first wiring pattern, and the second dummy pattern may be on the same level as the second wiring pattern.

In some embodiments, the dummy pattern may be on the same level as the first wiring pattern and/or the second wiring pattern.

An image sensor according to further embodiments of the invention includes a semiconductor substrate including an active pixel region and an optical black region. A light receiving region and a peripheral circuit region are defined on each of the active pixel region and the optical black region. The image sensor further includes photoelectric converters in the light receiving regions of the active pixel region and the optical black region, and wiring patterns on the peripheral circuit area of each of the active pixel region and the optical black region on the semiconductor substrate.

A dummy pattern is on the photoelectric converters and is configured to at least partially block incident light from penetrating to the photoelectric converters in the optical black region. A light shielding pattern is on the optical black region, and includes openings aligned with at least a portion of the dummy pattern. An inter-metal dielectric layer fills spaces between the wiring pattern, the light shielding pattern, and the dummy pattern, and a passivation layer is on the inter-metal layer.

Methods of forming an image sensor according to some embodiments of the invention include providing a semiconductor substrate on which an active pixel region and an optical black region are defined, forming photoelectric converters in the active pixel region and the optical black region of the semiconductor substrate, and forming a wiring pattern on the active pixel region and the optical black region, and a dummy pattern in the optical black region. The dummy pattern may at least partially block incident light from reaching the photoelectric converter in the optical black region.

The methods further include forming a light shielding pattern on the wiring pattern and the dummy pattern in the optical black region. The light shielding region includes an opening therein that is positioned over portions of the dummy pattern so that the light incident on the optical black region can be blocked by the light shielding pattern and/or the dummy pattern. The methods further include forming a passivation layer on the light shielding pattern. The dummy pattern may be formed on the same level as the wiring pattern.

After forming the passivation layer, a hydrogen annealing process may be performed on the semiconductor substrate so that hydrogen provided to the optical black region in the hydrogen annealing process passes through the opening in the light shielding region, and then diffuses to the semiconductor substrate through an opening in the dummy pattern.

A portion of the light shielding pattern may be formed on the active pixel region, and the portion of the light shielding pattern formed on the active pixel region may be aligned with portions of the wiring pattern.

A light receiving region and a peripheral circuit region may be defined on each of the active pixel region and the optical black region, a photoelectric converter may be formed in the light receiving region, and the wiring pattern may be formed on the peripheral circuit region.

The wiring pattern may include a first wiring pattern and a second wiring pattern, and the second wiring pattern may be aligned on the first wiring pattern.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

An image sensor according to embodiments of the present invention may be a charge coupled device (CCD) or a CMOS image sensor. CCDs may have advantages of lower noise and/or higher image quality, but may need high voltage to operate and/or may be costly to manufacture. CMOS image sensors may be easier to drive, and can be used to implement various scanning schemes. Moreover, signal processing circuits can be integrated into a single chip, so that product miniaturization can be achieved. Since conventional CMOS fabrication technology can be used for fabricating a CMOS image sensor, it may be possible to reduce the manufacturing costs. Furthermore, since a CMOS image sensor may consume relatively little power, it may be suitable for employing in a device with limited battery capacity. Therefore, hereinafter, a CMOS image sensor will be described as an embodiment of the present invention. However, it is to be understood by those skilled in the art that the technical principles described herein can be applied to a CCD.

Hereinafter, a CMOS image sensor according to embodiments of the present invention will be described with reference to appended drawings.

Figure 1:
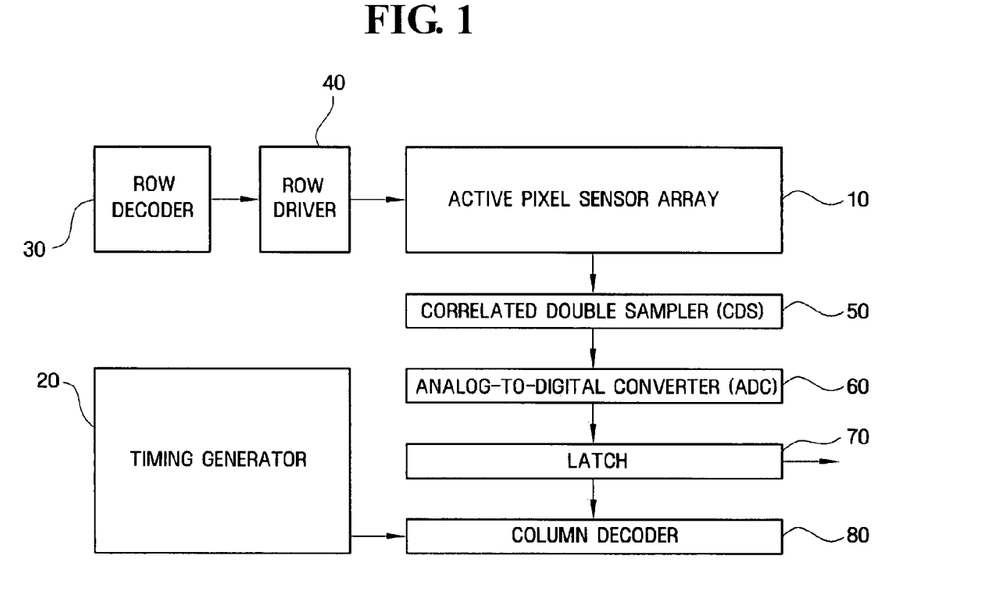
FIG. 1 is a block diagram of a complementary metal oxide semiconductor (CMOS) image sensor according to some embodiments of the present invention.

FIG. 1 is a block diagram of a complementary metal oxide semiconductor (CMOS) image sensor according to some embodiments of the present invention.

Referring to FIG. 1, a CMOS image sensor according to embodiments of the present invention includes an active pixel sensor (APS) array 10, a timing generator 20, a row decoder 30, a row driver 40, a correlated double sampler (CDS) 50, an analog to digital converter (ADC) 60, a latch 70, and a column decoder 80.

The APS array 10 includes a plurality of unit pixels that are aligned in a two-dimensional manner. The plurality of unit pixels act to convert optical images to electrical signals. The APS array 10 is driven by receiving a plurality of driving signals, such as a pixel selection signal ROW, a reset signal RST, a charge transfer signal TG, and the like, from the row driver 40. The converted electrical signal is provided to the CDS 50 through a vertical signal line.

The timing generator 20 provides a timing signal and a control signal to the row decoder 30 and the column decoder 80.

The row driver 40 provides a plurality of driving signals for driving the plurality of unit pixels to the APS array 10, depending on a decoding result of the row decoder 30. In general, when the unit pixels are aligned in a matrix form, a driving signal is provided to each column.

The CDS 50 receives the electrical signal produced in the APS array 10 through the vertical signal line, and holds and samples the electrical signal. More specifically, the CDS 50 samples a particular reference voltage level (hereinafter, referred to as a noise level) and a voltage level (hereinafter, referred to as a signal level) due to the received electrical signal, thereby outputting a difference level corresponding to difference between the noise level and the signal level.

The ADC 60 converts an analog signal corresponding to the difference level into a digital signal, and outputs the digital signal.

The latch 70 latches digital signals, and the latched signals are output sequentially to an image signal processing unit (not shown) according to a decoding result of the column decoder 80.

Figure 2:
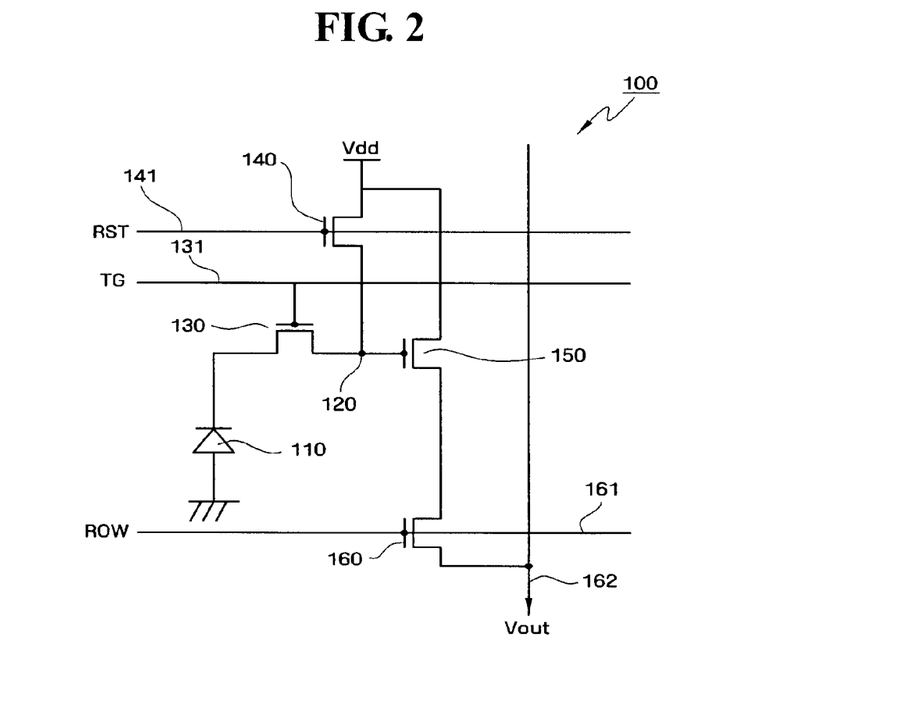
FIG. 2 is a circuit diagram of a unit pixel in a CMOS image sensor according to some embodiments of the present invention.

FIG. 2 is a circuit diagram of a unit pixel in a CMOS image sensor according to some embodiments of the present invention.

Referring to FIG. 2, a CMOS image sensor according to some embodiments of the present invention includes a unit pixel 100 including a photoelectric converter 110, a charge detector 120, a charge transfer portion 130, a reset portion 140, an amplifier 150, and a selector 160. In FIG. 2, the unit pixel is illustrated as including four transistors, but the unit pixel may include five transistors in some embodiments.

The photoelectric converter 110 absorbs incident light and stores an amount of charge corresponding to the quantity of light absorbed. The photoelectric converter 110 may be a photo diode, a photo transistor, a photo gate, a pinned photo diode (PPD), and/or a combination of one or more of the foregoing.

Generally, a floating diffusion region is used as the charge detector 120, and the charge detector 120 receives the stored charge from the photoelectric converter 110. Because of the parasitic capacitance of the charge detector 120, charge is stored in an accumulated manner. The charge detector 120 is electrically connected to a gate of the amplifier 150, and thereby controls operation of the amplifier 150.

The charge transfer portion 130 transmits charge from the photoelectric converter 110 to the charge detector 120. Generally, the charge transfer portion 130 includes one transistor, and is controlled in response to a charge transfer signal TG.

The reset portion 140 can be used to reset the charge detector 120 regularly. A source of the reset portion 140 is connected to the charge detector 120, and a drain thereof is connected to a supply voltage Vdd. Also, the reset portion 140 can be driven in response to a reset signal RST.

The amplifier 150 acts as a source follower buffer amplifier, in conjunction with a constant current source (not shown) which is located outside of the unit pixel 100, and outputs a voltage that changes in response to a voltage of the charge detector 120, through a vertical signal line 162. A source of the amplifier 150 is connected to a drain of the selector 160, and a drain of the amplifier 150 is connected to Vdd.

The selector 160 selects the unit pixel 100 to be read column by column. Also, the selector 160 is driven in response to a select signal ROW, and a source of the selector 160 is connected to the vertical signal line 162.

Driving signal lines 131, 141, and 161 of the charge transfer portion 130, the reset portion 140 and the selector 160, respectively, extend in a row direction (in a horizontal direction) to drive unit pixels located in the same row simultaneously.

Hereinafter, referring to FIGS. 3A through 5, a CMOS image sensor according to embodiments of the present invention will be described.

Figure 3A:
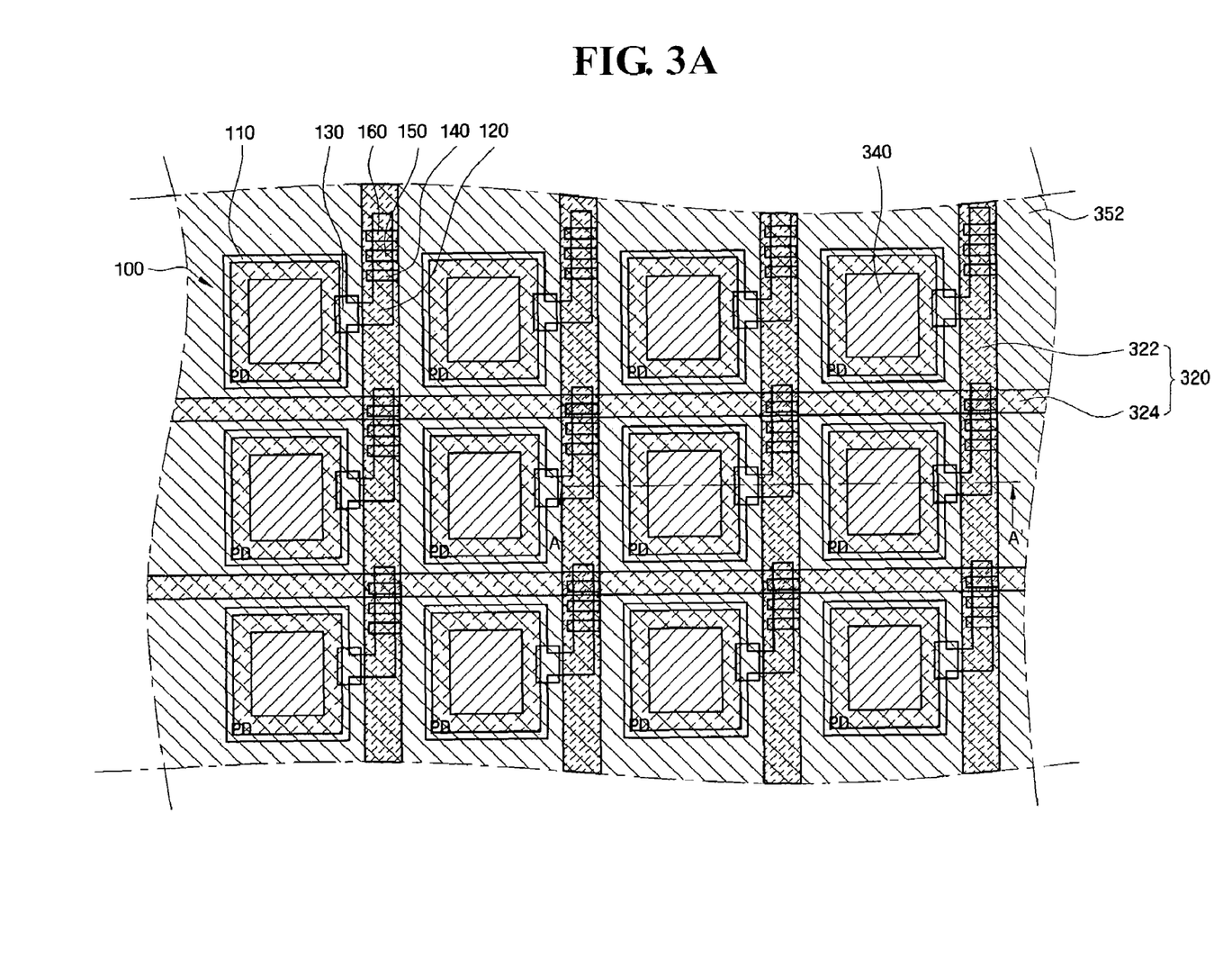
FIGS. 3A through 3C are layout diagrams schematically showing an optical black region of a CMOS image sensor according to some embodiments of the present invention.
Figure 3B:
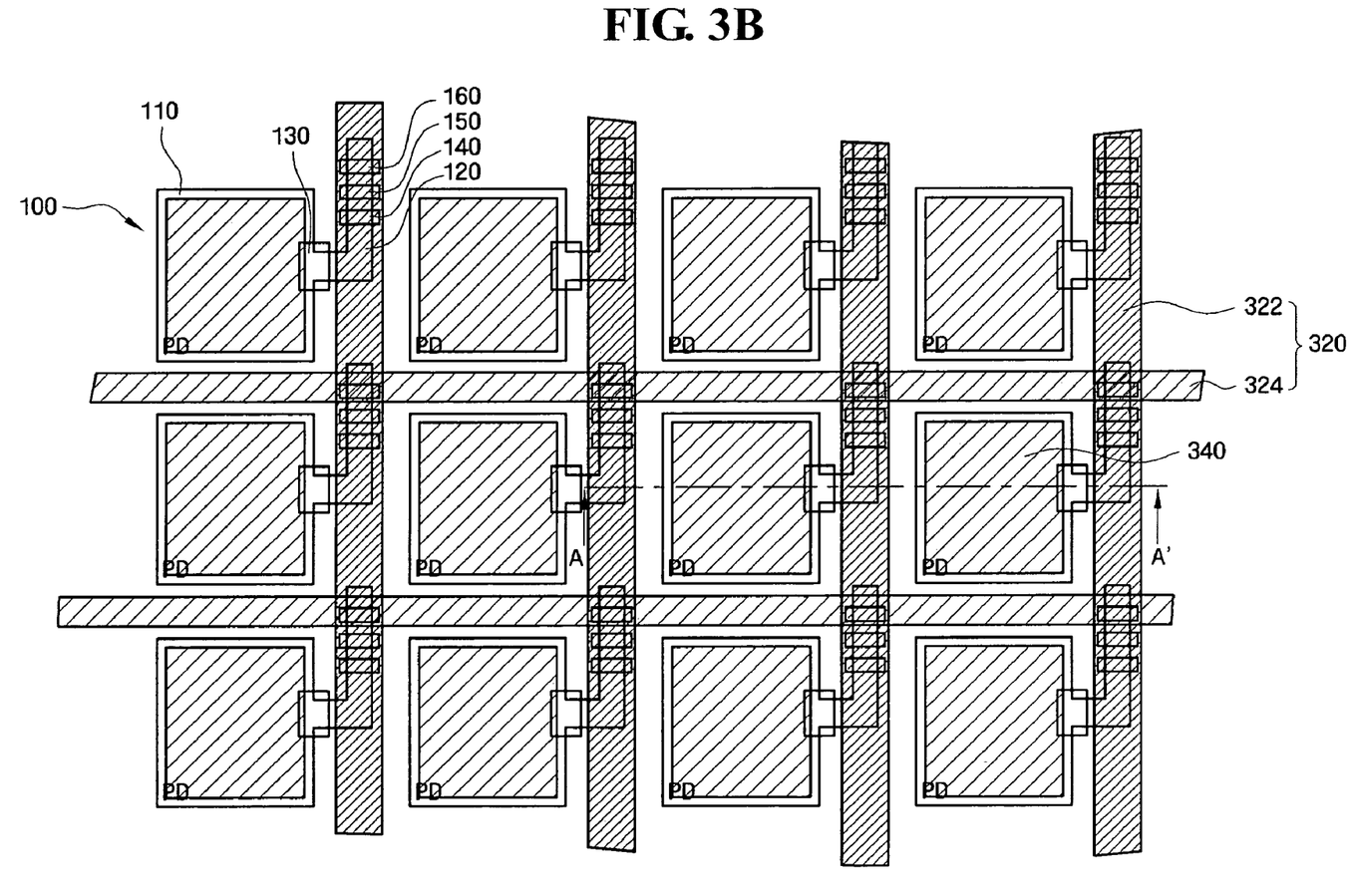
Figure 3C:
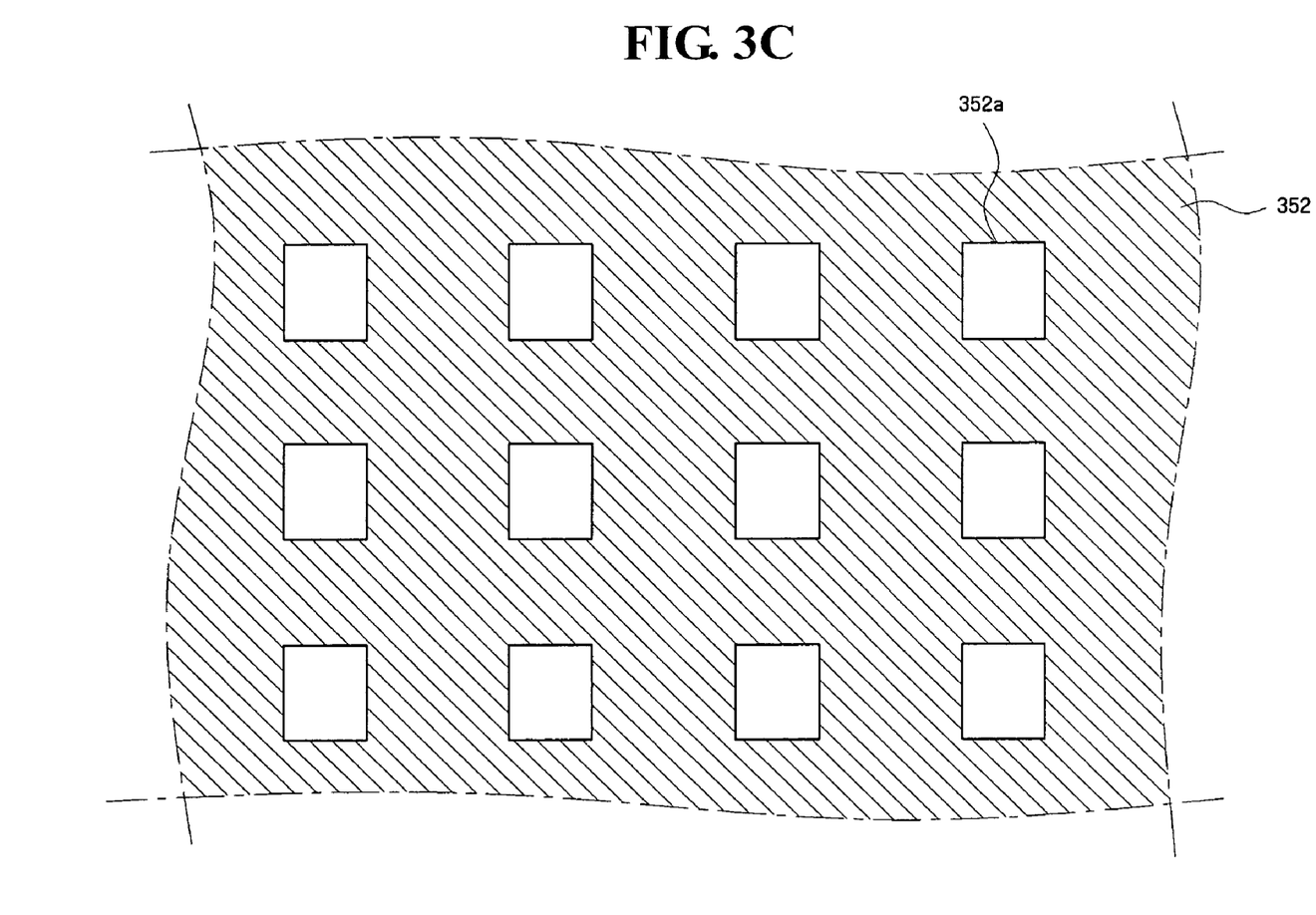
Figure 4A:
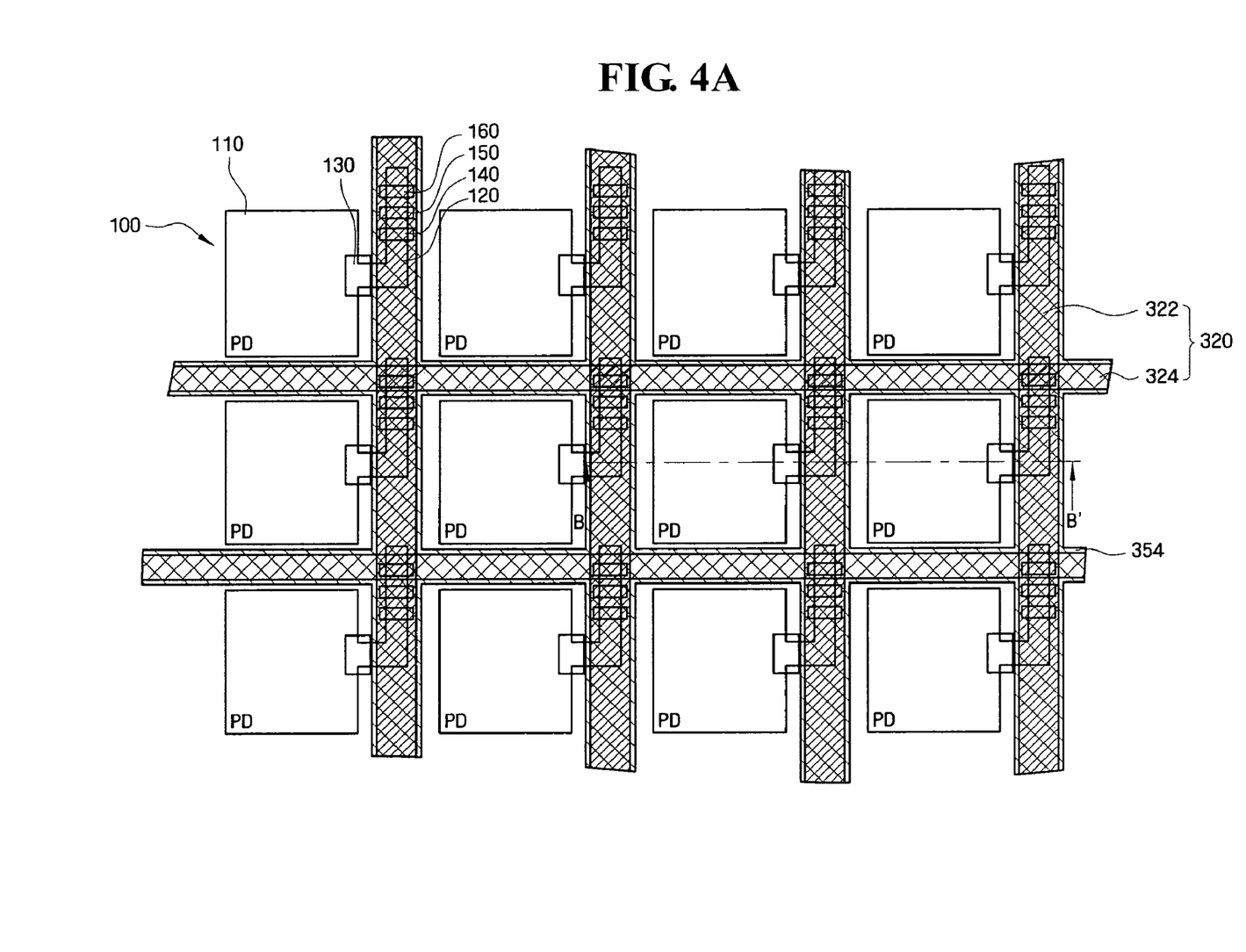
FIGS. 4A and 4B are layout diagrams schematically showing an active pixel region of a CMOS image sensor according to some embodiments of the present invention.
Figure 4B:
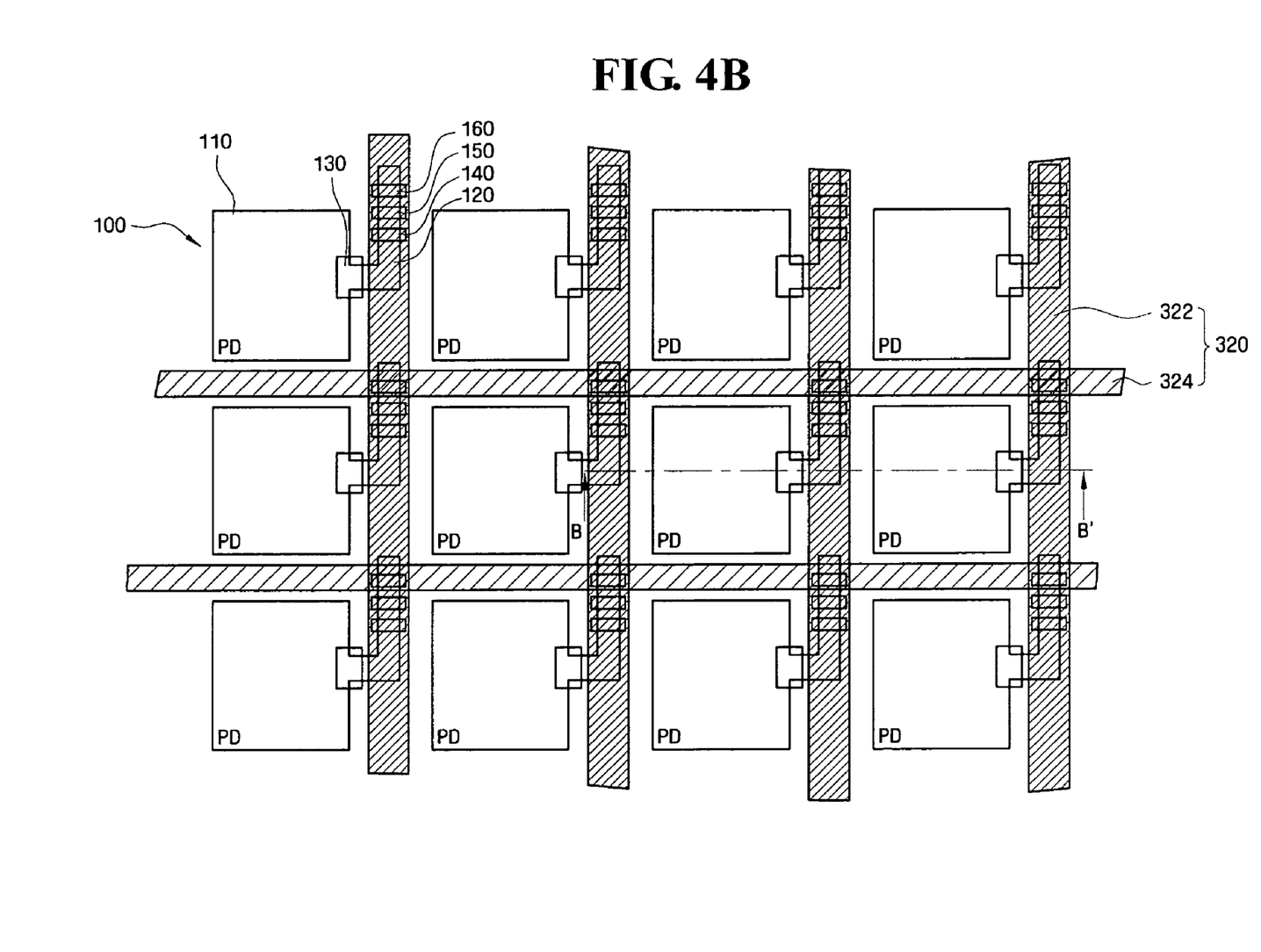
Figure 5:
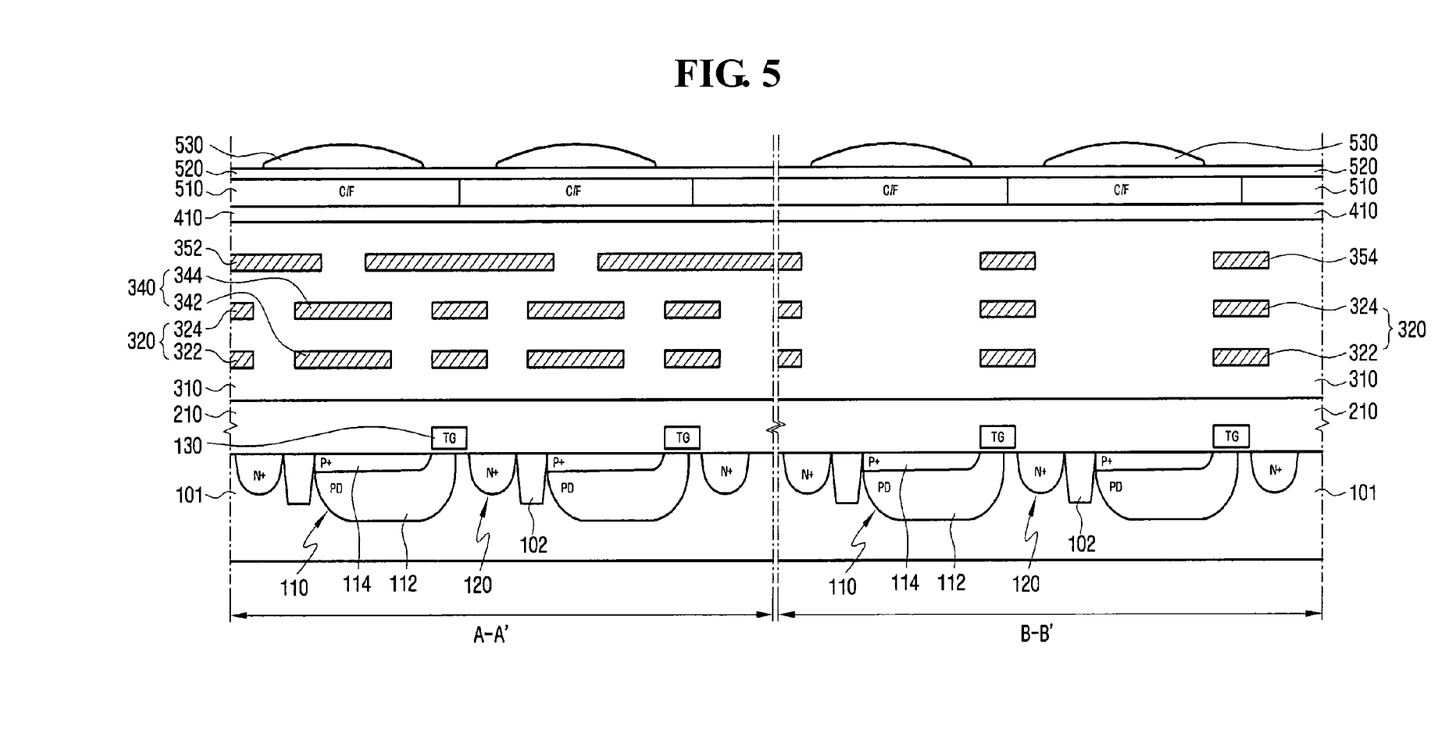
FIG. 5 shows cross-sectional views of a CMOS image sensor according to some embodiments of the present invention, taken along lines A-A' of FIG. 3A and of a CMOS image sensor according to some embodiments of the present invention, taken along lines B-B' of FIG. 4A.

FIGS. 3A through 3C are layout diagrams schematically showing an optical black region of a CMOS image sensor according to embodiments of the present invention, FIGS. 4A and 4B are layout diagrams schematically showing an active pixel region of a CMOS image sensor according to embodiments of the present invention, and FIG. 5 shows cross-sectional views of the CMOS image sensor according to embodiments of the present invention, taken along lines A-A' of FIG. 3A and of the CMOS image sensor according to embodiments of the present invention, taken along lines B-B' of FIG. 4A.

Referring to FIGS. 3A through 5, the CMOS image sensor includes a semiconductor substrate 101, and photoelectric converters 110, charge detectors 120, charge transfer portions 130, wiring patterns 320, dummy patterns 340, a first light shielding wiring pattern 352, a second light shielding wiring pattern 354, an inter-metal dielectric layer 310, a passivation layer 410, color filters 510 and micro lenses 530, which are formed on the semiconductor substrate 101.

Isolation regions 102 are formed on the semiconductor substrate 101 to define active regions. The isolation regions 102 may be field oxide layer (FOX) or shallow trench isolation (STI) regions.

Active pixel regions and optical black regions are defined on the semiconductor substrate 101. The active pixel region receives light and converts the received light into an electrical signal, and the optical black region, which provides a reference signal to the active pixel region, does not receive light. FIG. 3A is a layout diagram schematically showing an optical black region of a CMOS image sensor according to embodiments of the present invention, and FIG. 4A is a layout diagram schematically showing an active pixel region of the CMOS image sensor according to embodiments of the present invention. FIG. 5 is a cross-sectional view of the optical black region of FIG. 3A and the active pixel region of FIG. 4A.

The photoelectric converters 110, each of which absorbs light energy and responsively generates accumulated charge thereon, are formed on an active region of the semiconductor substrate 101. The photoelectric converter 110 includes an N-type photodiode 112 and a P+-type pinning layer 114.

Moreover, the charge detectors 120 and transistors which correspond to the charge transfer portions 130, reset portions 140, amplifiers 150, and selectors 160 are formed on the semiconductor substrate 101.

An interlayer dielectric layer 210, which covers the entire surface of the semiconductor substrate 101, is formed on the photoelectric converter 110 and the charge transfer portions 130 so as to fill the vacant space where transistors are not placed. The interlayer dielectric layer 210 may include a silicon dioxide ($SiO_2$) film.

Wiring patterns 320 and dummy patterns 340 are disposed on the top of the interlayer dielectric layer 210. In FIG. 3B, the wiring pattern 320 and the dummy pattern 340 are formed on a pixel array of the optical black region, and in FIG. 4B, only the wiring pattern 320 is formed on a pixel array of the active pixel region.

Each of the wiring patterns 320 may include a single layer, two layers, or three layers. FIGS. 3A, 3B, 4A, 4B, and 5 illustrate the wiring patterns 320, each of which may include a first wiring pattern 322 and a second wiring pattern 324. The wiring pattern 320 may include, for example, aluminum (Al), tungsten (W), copper (Cu), or the like. The wiring patterns 320, which may be formed in the same manner on the active pixel area and the optical black area, may be formed on a peripheral circuit region of the respective active pixel region and optical black region. The peripheral circuit region refers to a region where the photoelectric converters 110 are not formed on the semiconductor substrate 101. A region where the photoelectric converters 110 are formed is referred to as a light receiving region. Thus, each of the active pixel region and the optical black region may include a light receiving region and a peripheral circuit region.

The second wiring pattern 324 may be disposed over the first wiring pattern 322. In this case, the first wiring pattern 322 and the second wiring pattern 324 may be connected by via-holes (not shown).

The dummy pattern 340 (formed at the same level as the wiring pattern 320) may be formed on the top of each photoelectric converter 110 in the optical black region. The dummy pattern 340 in the optical black region may block light from reaching all or part of the photoelectric converter 110. Although in the embodiments illustrated in FIGS. 3A, 3B and 5, the dummy pattern 340 is formed separately from the wiring pattern 320 in the photoelectric converter 110, the dummy pattern 340 may be connected to the wiring pattern 320 in some embodiments.

The dummy pattern 340 may include a first dummy pattern 342 and a second dummy pattern 344. The first dummy pattern 342 may be formed on the same level as the first wiring pattern 322, and the second dummy pattern 344 may be aligned with the second wiring pattern 324. In FIG. 5, the CMOS image sensor has both the first dummy pattern 342 and the second dummy pattern 324, which are formed thereon, but the CMOS image sensor may include only one of either the first dummy pattern 342 or the second dummy pattern 344.

The first light shielding wiring pattern 352 and/or the second light shielding wiring pattern 354 is disposed on the top of the wiring patterns 320 and dummy patterns 340. FIG. 3C illustrates the first light shielding wiring pattern 352 formed on the optical black region.

The first light shielding pattern 352 is disposed on the top of the wiring pattern 320 and dummy pattern 340 in the optical black region. The first light shielding wiring pattern 352 includes openings 352a, each of which exposes the whole or part of the dummy pattern 340. Since the openings are formed to expose the whole or part of the dummy pattern 352, the width of each opening 352a may be smaller than or the same as the width of the dummy pattern 340.

The second light shielding wiring pattern 354 may be disposed on the active pixel area. The second light shielding wiring pattern 354 on the active pixel area is aligned with the wiring pattern 320. That is, on the active pixel region, the second light shielding wiring pattern 354 is formed to open the whole photoelectric converter 110.

The first and second light shielding wiring patterns 352 and 354 act as shielding layers to block incident light. Furthermore, the first and second light shielding wiring patterns 352 and 354 may be used as wiring which voltage is applied to. That is, the first and second light shielding wiring patterns 352 and 354 may be used as both shielding layers and wiring patterns, or may be used only as shielding layers.

The inter-metal dielectric layer 310 fills the space between the wiring pattern 320, the first and second light shielding wiring patterns 352 and 354, and the dummy pattern 340. The inter-metal dielectric layer 310 may include a flowable oxide (FOX) layer, a high density plasma (HDP) layer, a torene silazene (TOSZ) layer, a spin on glass (SOG) layer, an undoped silicate glass (USG) layer, or the like.

The passivation layer 410 is formed on the inter-metal dielectric layer 310. The passivation layer 410 may include a dielectric layer, such as a nitride layer. The passivation layer 410 protects the wiring pattern 320 and the unit pixel 100 which are formed beneath the passivation layer 410. Also, through heat processing, the passivation layer 410 can provide hydrogen to the semiconductor substrate 101.

The color filters 510 are formed on the passivation layer 410. The color filters 510, which may include red, green and blue color filters, may be arranged in a Bayer-type pattern. In the Bayer-type pattern, a half of all color filters 510 are green color filters 510 which need accuracy because human eyes react to the green color most sensitively. However, the color filters 510 may be arranged in other ways.

A micro-lens 530 is formed on each of the color filters 510, corresponding to the photoelectric converter 110. The micro-lens may be made of, for example, TMR series resin and/or MFR series resin. The micro-lens 530 changes the path of the light incident to regions other than the photoelectric converter 110 and may concentrate the light onto the photoelectric converter 110.

A planarization layer 520 is interposed between the color filter 510 and the micro-lens 530. The planarization layer 520 may include, for example, thermosetting resin.

Figure 6:
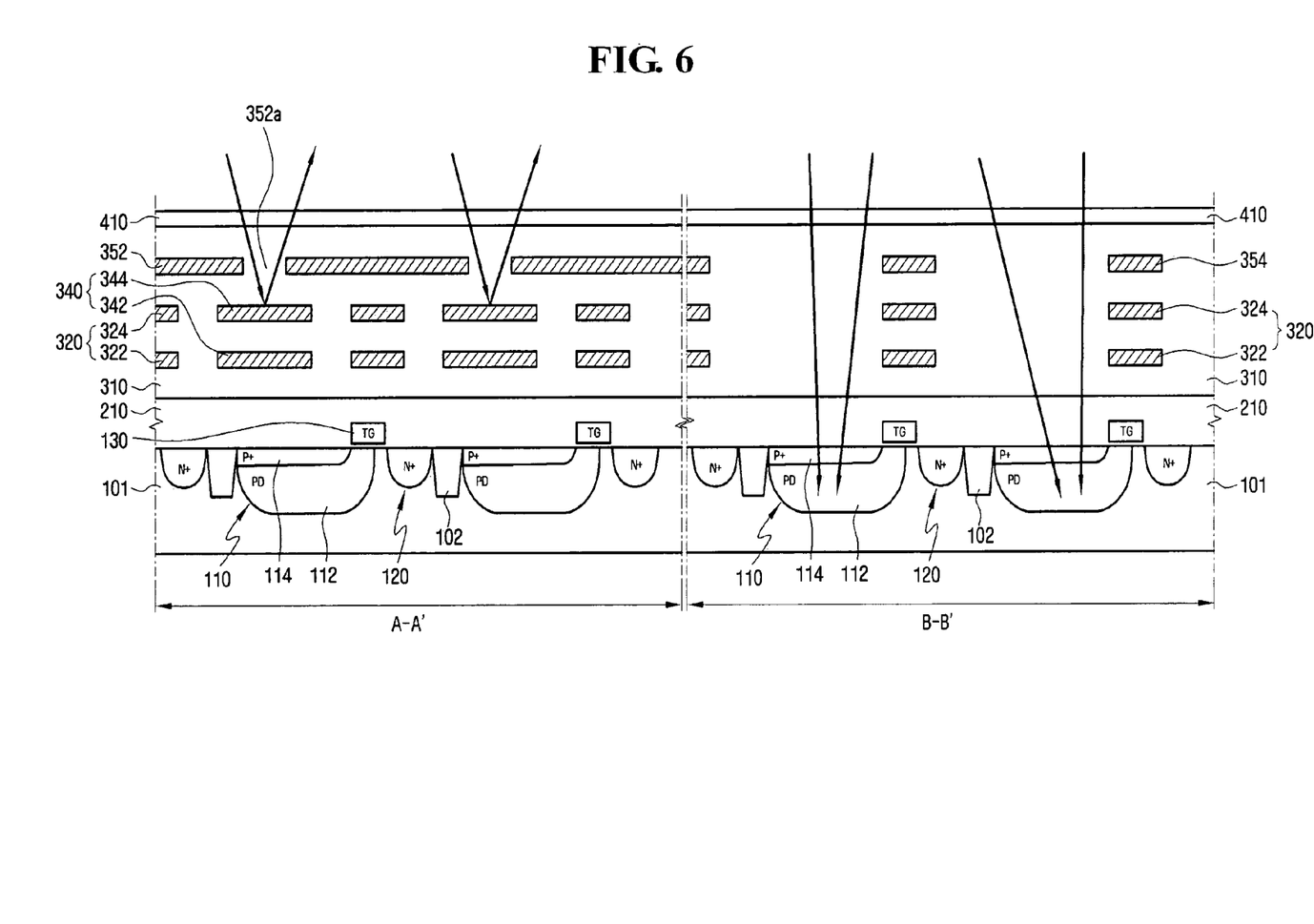
FIGS. 6 and 7 are cross-sectional views of a CMOS image sensor to explain effects of the CMOS image sensor according to embodiments of the present invention.
Figure 7:
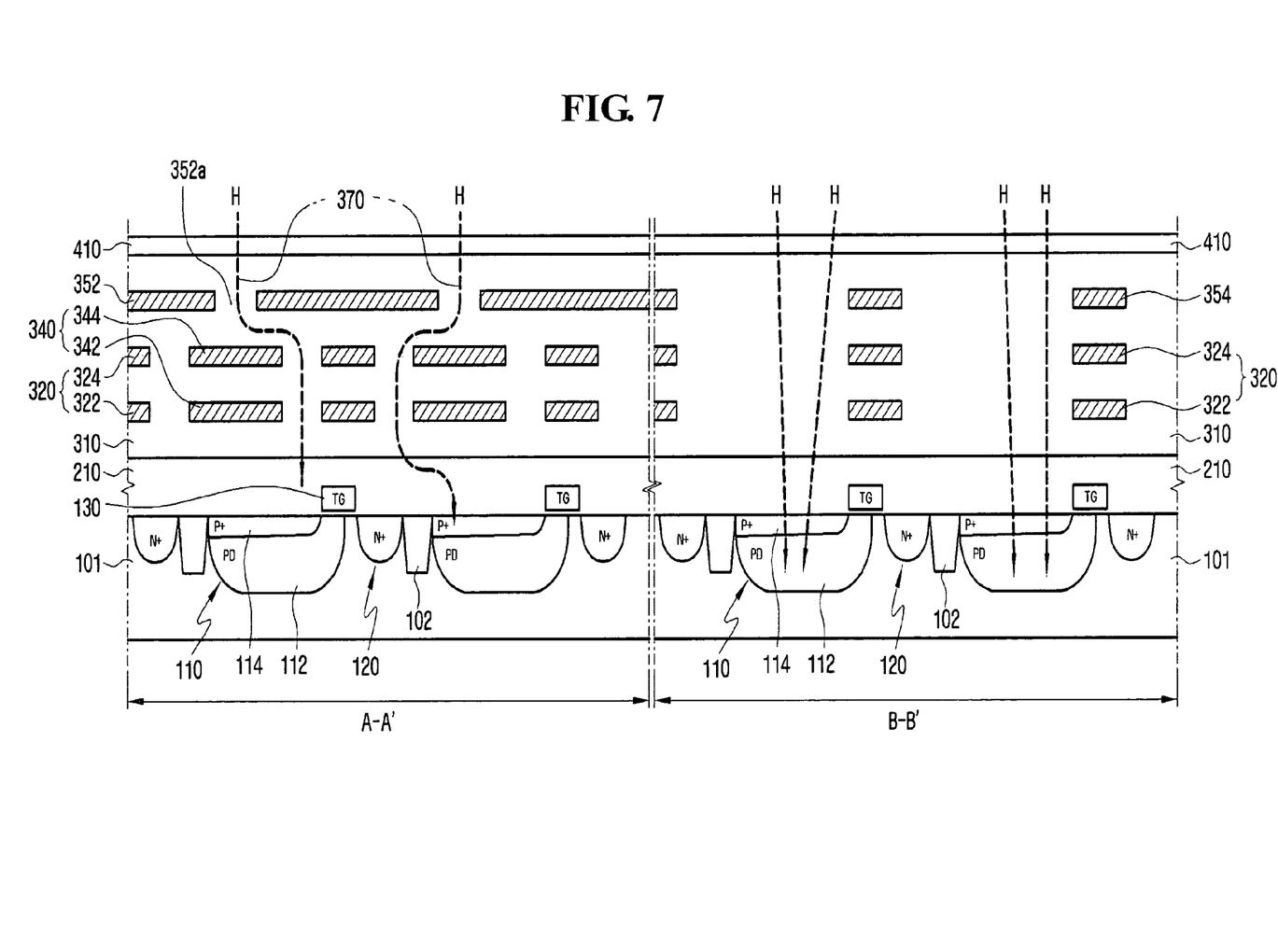

FIGS. 6 and 7 are cross-sectional views of a CMOS image sensor according to embodiments of the present invention.

Referring to FIG. 6, a path of the light incident to the CMOS image sensor according to some embodiments of the present invention will first be described.

The dummy pattern 340 and the first light shielding wiring pattern 352 are formed on the optical black region of the CMOS image sensor according to some embodiments of the present invention. Since the width of the dummy pattern 340 is greater than the width of the opening 352a of the first light shielding wiring pattern 352, the light incident through the opening 352a of the first light shielding wiring pattern 352 may be reflected by the dummy pattern 340. Therefore, the light may not generally be able to penetrate to the photoelectric converter 110 in optical black region.

Meanwhile, the dummy pattern 340 is not formed on the active pixel region of the CMOS image sensor according to embodiments of the present invention, but only the second light shielding wiring pattern 354 is formed thereon. The second light shielding wiring pattern 354 is formed only on the peripheral circuit region where the photoelectric converters 110 are not formed. Therefore, the incident light is concentrated on each photoelectric converter 110. However, the light incident to the peripheral circuit region where the photoelectric converters 110 are not formed is blocked by the second light shielding wiring pattern 354, so that the light is at least partially prevented from being reflected or refracted by the wiring pattern 320.

Hereinafter, referring to FIG. 7, hydrogen diffusion paths 370 in an image sensor according to embodiments of the present invention will be described.

In the course of fabricating an image sensor, a hydrogen annealing process can be performed to remove dangling bonds. During the annealing process, if hydrogen diffusion paths 370 that allow the hydrogen to diffuse to the semiconductor are provided, the dangling bonds can be removed more effectively.

The hydrogen diffusion paths 370, each of which reaches the semiconductor substrate 101, passing through the opening 352a of the first light shielding wiring pattern 352 and a region between the wiring pattern 320 and the dummy pattern 340, are formed on the optical black region of a CMOS image sensor according to some embodiments of the present invention. Since there is no wiring formed on the top of the active pixel region, the hydrogen can diffuse to the semiconductor substrate 101 easily in the active pixel region. That is, in a CMOS image sensor according to some embodiments of the present invention, a hydrogen diffusion path 370 can be provided in the optical black region, even though the incident light is blocked. In other words, the optical black region according to some embodiments acts to provide a proper reference value of a signal, because the incident light may be effectively shielded. Moreover, a hydrogen diffusion path 370 is provided, and thus dangling bonds may be removed effectively, thereby reducing dark currents. In addition, since the dangling bonds may be removed from both the optical black region and the active pixel region effectively, signals with the same reference level can be detected in both the optical black region and the active pixel region, and thus the reliability of the CMOS image sensor can be improved.

Figure 8:
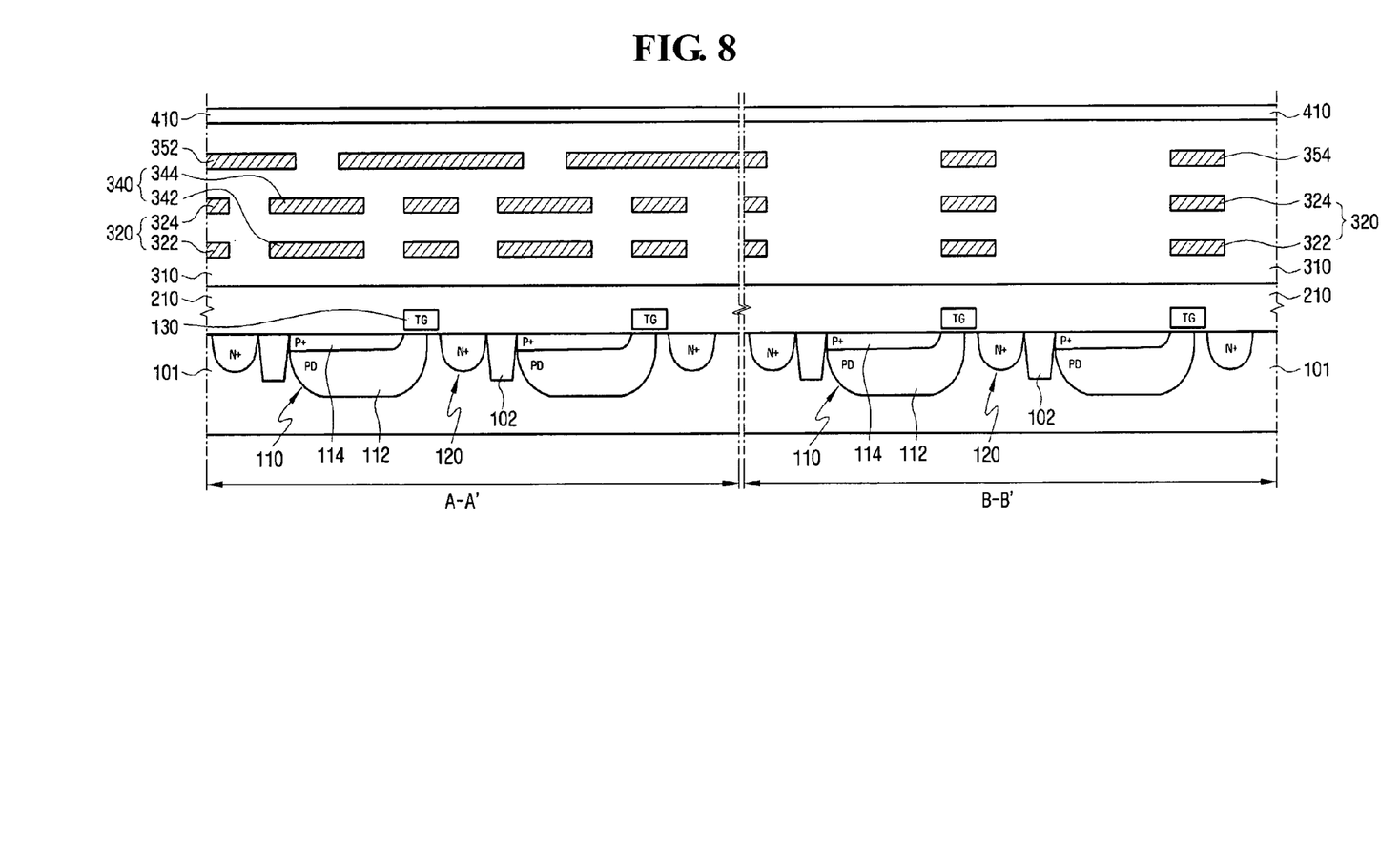
FIG. 8 is a cross-sectional view of a CMOS image sensor to explain methods of fabricating a CMOS image sensor according to embodiments of the present invention.

Hereinafter, methods of forming a CMOS image sensor according to embodiments of the present invention will be described referring to FIGS. 5 through 8. FIG. 8 is a cross-sectional view of a CMOS image sensor that illustrates methods of forming the CMOS image sensor according to embodiments of the present invention.

Referring to FIG. 8, isolation regions 102 are first formed on a semiconductor substrate 101, on which an active black region and an optical black region are defined, to define an active region (not shown). Then, impurity ions are injected into the active region to form photoelectric converters 110, each of which includes a photodiode 112 and a pinning layer 114, and charge detectors 120 and transistors which correspond to a charge transfer portion 130, a reset portion 140 (referring to FIG. 2), an amplifier 150 (referring to FIG. 2) and a selector 160 (referring to FIG. 2), respectively. Next, an interlayer dielectric layer 210 is formed to cover the whole surface of the semiconductor substrate 101 and fill the vacant space where the transistors are not formed.

Afterwards, a wiring pattern 320 is disposed on the interlayer dielectric layer 210 of the active pixel region and of the optical black region, and in the optical black region, a dummy pattern 340 is formed at the same level as the wiring pattern 320.

More specifically, a conductive layer (not shown) including Al, TiN, Ti, Cu, or the like is deposited and patterned to form a first wiring pattern 322 and a first dummy pattern 342. The first dummy pattern 342 may be formed together with the first wiring pattern 332 by patterning the conductive layer, thereby blocking the whole or part of the photoelectric converter 110 in the optical black region. A conductive layer is deposited on the first wiring pattern 322 and the first dummy pattern 342 and is patterned to form a second wiring pattern 324 and a second dummy pattern 344. The second wiring pattern 324 may be aligned with the first wiring pattern 322, and the second dummy pattern 344 may be formed to block the whole or part of the photoelectric converter 110 in the optical black region.

Still referring to FIG. 8, the CMOS image sensor includes both the first dummy pattern 342 and the second dummy pattern 344 which are formed thereon, but in some embodiments only the first dummy pattern 342 or the second dummy pattern 344 may be formed on the CMOS image sensor. Also, the wiring pattern 320 includes the first wiring pattern 322 and the second wiring pattern 324 in FIG. 8, but the wiring pattern 320 may be made of a single layer, two layers, or three layers, for example.

Next, first and second light shielding wiring patterns 352 and 354 are formed on the second wiring pattern 324 and the second dummy pattern 344. More specifically, a conductive layer is deposited on the second wiring pattern 324 and the second dummy pattern 344, and then is patterned to form the first and second light shielding wiring layers 352 and 354. The first light shielding wiring pattern 352 is formed on the optical black region, and the second light shielding wiring pattern 354 is formed on the active pixel region.

Openings 352a are formed on the first light shielding wiring layer 352 on the optical black region to open the whole or part of the top of the dummy pattern 340. In other words, the openings 352a are arranged so that the dummy pattern 340 and the first light shielding wiring layer 352 together block substantially all light incident on the optical black region.

The second light shielding wiring layer 354 formed on the active pixel region is aligned with the wiring pattern 320 to be placed in a peripheral circuit region. That is, the second light shielding wiring layer is formed to concentrate the light incident to the top of the photoelectric converter on the photoelectric converter 110.

An inter-metal dielectric layer 310 fills spaces between the first and second wiring patterns 322 and 324, between the first and second dummy patterns 342 and 344, and between the first and second light shielding wiring patterns 352 and 354.

A passivation layer 410 is formed on the first and second light shielding wiring layers 352 and 354. The passivation layer 410 may include a dielectric layer, such as a nitride layer.

As shown in FIG. 7, a hydrogen annealing process is performed. In the hydrogen annealing process, hydrogen is provided to the semiconductor substrate 101 to remove dangling bonds in the semiconductor substrate 101. The hydrogen annealing process can be performed by doing an annealing process after forming the passivation layer 410 and then diffusing the hydrogen included in the passivation layer 410 to the semiconductor substrate 101. Alternatively, the annealing process may be performed while additional hydrogen is provided, and then the hydrogen may be diffused to the semiconductor substrate 101.

In the course of the hydrogen annealing process, the hydrogen provided to the optical black region passes through the opening 352a of the first light shielding wiring pattern 352, and diffuses to the semiconductor substrate 101 through a region between the wiring pattern 320 and the dummy pattern 340. The hydrogen provided to the active pixel region can diffuse directly to the semiconductor substrate 101.

According to some embodiments of the present invention, a hydrogen diffusion path can be provided in a CMOS image sensor, enabling the effective removal of dangling bonds generated in both the optical black region and the active pixel region. Therefore, signals having the same reference level can be detected in both the optical black region and the active pixel region, thereby potentially enhancing the reliability of the CMOS image sensor.

Referring back to FIG. 5, color filters 510 and micro-lenses 530 are formed on the passivation layer 410. First, the color filters 510 are formed on the passivation layer 410. The color filters 510, which may include red, green, and blue color filters, may be arranged, for example, in a Bayer-type pattern. Then, a planarization layer 520 may be formed on the color filters 510. The planarization layer 520 is for planarization of the top surface of the passivation layer 410 where the color filters are arranged. The planarization layer 520 may be formed by forming thermosetting resin using a spin-on coating process and then applying heat to the resin to harden. Afterwards, the micro-lenses 530 are formed on the planarization layer 520 in locations corresponding to the photoelectric converters 110.

According to some embodiments of the present invention, while the light incident to the optical black region of a CMOS image sensor may be substantially blocked, a hydrogen diffusion path may be provided, thereby enabling formation of a CMOS image sensor with enhanced reliability.

Figure 9:
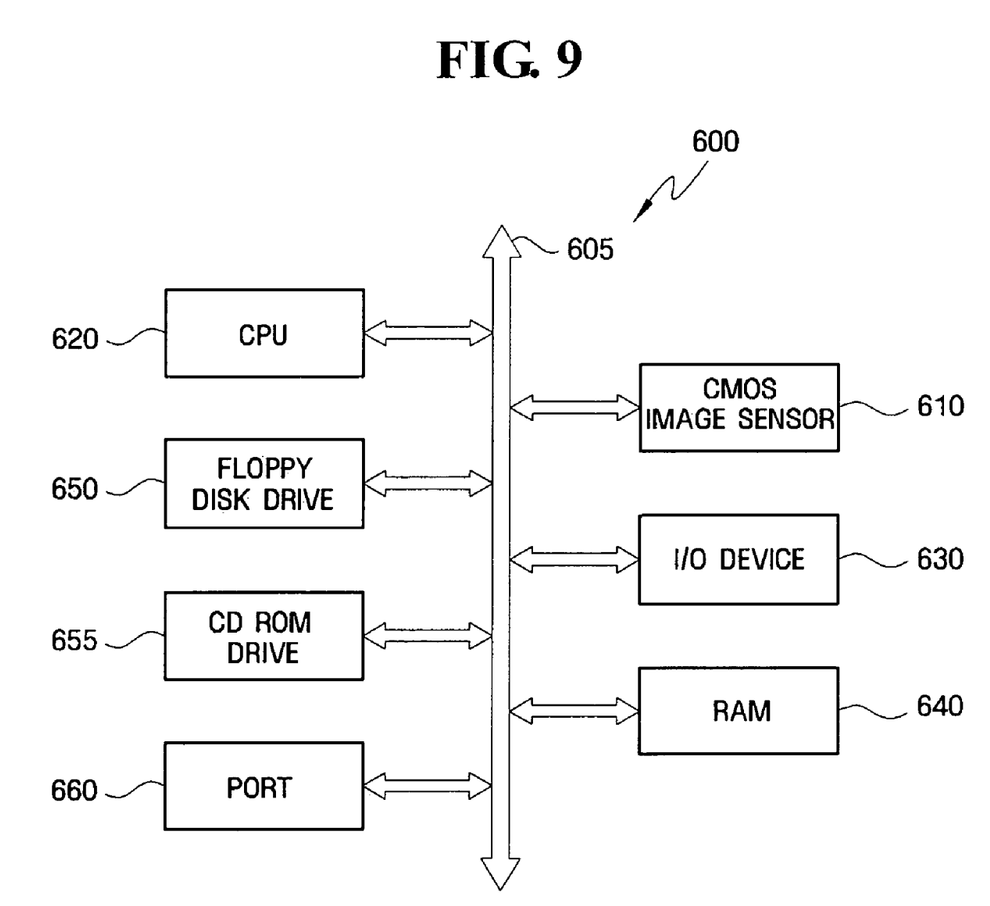
FIG. 9 shows schematically a processor based system that includes a CMOS image sensor according to embodiments of the present invention.

FIG. 9 shows schematically a processor based system 600 which includes a CMOS image sensor 610 according to some embodiments of the present invention.

Referring to FIG. 9, the processor-based system 600 processes images output from the CMOS image sensor 610. The system 600 may be a computer system, a camera system, a scanner, a mechanized clock system, a navigation system, a video phone, a directing system, an auto-focusing system, a tracking system, a movement monitoring system, and/or an image stabilization system, but the system 600 is not limited thereto.

The processor based system 600, such as a computer, includes a central processing unit (CPU) 320, such as a microprocessor, which is able to communicate with an input/output (I/O) element 630 through a bus 605. The CMOS image sensor 610 is able to communicate with the system 600 through the bus 605 or any other communication link. The processor based system 600 may further include a random access memory (RAM) 640, a floppy disk drive 650 and/or a CD ROM drive 655, and a port 660 which allow the system 600 to communicate with the CPU 320 through the bus 605. A video card, a sound card, a memory card, or a USB element may be coupled to the port 660, or the port 660 may allow the system 600 to communicate data to another system. The CMOS image sensor 610 may be integrated with a CPU, a digital signal processing device (DSP), and/or a microprocessor. Also, the CMOS image sensor 610 may be integrated with a memory. However, depending on the particular application, the CMOS image sensor 610 may be integrated on a chip separately from a processor.

According to embodiments of the present invention, a CMOS image sensor and a method of fabricating the same may have one or more effects. For example, in an optical black region, while the incident light is blocked, a hydrogen diffusion path can be obtained. Therefore, dangling bonds can be removed effectively, which may reduce dark currents. Furthermore, since dangling bonds can be effectively removed from both the optical black region and the active pixel region, signals having the same reference level can be detected in both the optical black region and the active pixel region, thereby potentially improving the reliability and/or performance of the CMOS image sensor.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An image sensor, comprising:
    a semiconductor substrate including an active pixel region and an optical black region;
    a wiring pattern on the active pixel region and on the optical black region;
    a light shielding pattern on the wiring pattern in the optical black region, the light shielding pattern including openings therein;
    a dummy pattern in the optical black region that is spaced apart from the light shielding pattern and that is configured to block light incident through the openings of the light shielding pattern;
    an inter-metal dielectric layer that fills spaces between the wiring pattern, the light shielding pattern, and the dummy pattern; and
    a passivation layer on the inter-metal dielectric layer.

2. The image sensor of claim 1, wherein the dummy pattern includes an opening therein, and wherein a hydrogen diffusion path is provided from the passivation layer, through the openings in the light shielding pattern and the opening in the dummy pattern, to the semiconductor substrate.

3. The image sensor of claim 1, wherein the dummy pattern is on the same level as the wiring pattern.

4. The image sensor of claim 1, wherein the light shielding pattern is also on the active pixel region, and portions of the light shielding pattern on the active pixel region are aligned with the wiring pattern.

5. The image sensor of claim 1, wherein a light receiving region and a peripheral circuit region are defined on each of the active pixel region and the optical black region, a photoelectric converter is in the light receiving region, and the wiring pattern is on the peripheral circuit region.

6. The image sensor of claim 5, wherein the openings of the light shielding pattern are on the light receiving region.

7. The image sensor of claim 6, wherein the dummy pattern is on the light receiving region.

8. The image sensor of claim 1, wherein the wiring pattern includes a first wiring pattern and a second wiring pattern, and the second wiring pattern is aligned on the first wiring pattern.

9. The image sensor of claim 8, wherein the dummy pattern includes a first dummy pattern and a second dummy pattern, wherein the first dummy pattern is on the same level as the first wiring pattern, and the second dummy pattern is on the same level as the second wiring pattern.

10. The image sensor of claim 8, wherein the dummy pattern is on the same level as the first wiring pattern.

11. The image sensor of claim 8, wherein the dummy pattern is on the same level as the second wiring pattern.

12. An image sensor, comprising:
 a semiconductor substrate including an active pixel region and an optical black region, wherein a light receiving region and a peripheral circuit region are defined on each of the active pixel region and the optical black region;
 photoelectric converters in the light receiving regions of the active pixel region and the optical black region;
 wiring patterns on the peripheral circuit area of each of the active pixel region and the optical black region on the semiconductor substrate;
 a dummy pattern on the photoelectric converters and configured to at least partially block incident light from penetrating to the photoelectric converters in the optical black region;
 a light shielding pattern on the optical black region, wherein the light shielding pattern includes openings aligned with at least a portion of the dummy pattern;
 an inter-metal dielectric layer that fills spaces between the wiring pattern, the light shielding pattern, and the dummy pattern; and
 a passivation layer on the inter-metal layer.

13. The image sensor of claim 12, wherein the dummy pattern is configured to block light incident through the openings of the light shielding pattern.

14. The image sensor of claim 12, wherein the dummy pattern includes an opening therein, and wherein a hydrogen diffusion path is provided from the passivation layer, through the opening in the light shielding pattern and the opening in the dummy pattern, to the semiconductor substrate.

15. The image sensor of claim 12, wherein the light shielding pattern is on the active pixel region and is aligned with the wiring pattern in the active pixel region.

16. The image sensor of claim 12 wherein the wiring pattern includes a first wiring pattern and a second wiring pattern, and the second wiring pattern is aligned on the first wiring pattern.

17. The image sensor of claim 16, wherein the dummy pattern includes a first dummy pattern and a second dummy pattern, the first dummy pattern is on the same level as the first wiring pattern, and the second dummy pattern is on the same level as the second wiring pattern.

18. The image sensor of claim 16, wherein the dummy pattern is on the same level as the first wiring pattern.

19. The image sensor of claim 12, wherein the dummy pattern is on the same level as the wiring pattern.

\* \* \* \* \*